United States Patent [19]
Kawai et al.

[11] Patent Number: 5,828,604
[45] Date of Patent: Oct. 27, 1998

[54] NON-VOLATILE SEMICONDUCTOR MEMORY DEVICE HAVING LARGE MARGIN OF READOUT OPERATION FOR VARIATION IN EXTERNAL POWER SUPPLY VOLTAGE

[75] Inventors: Shinji Kawai; Shinichi Kobayashi; Yasuhiko Taito, all of Hyogo, Japan

[73] Assignee: Mitsubishi Denki Kabushiki Kaisha, Tokyo, Japan

[21] Appl. No.: 781,247

[22] Filed: Jan. 10, 1997

[30] Foreign Application Priority Data

May 10, 1996 [JP] Japan ..................................... 8-116297

[51] Int. Cl.$^6$ ...................................................... G11C 7/00
[52] U.S. Cl. ............... 365/185.22; 365/148; 365/185.21; 365/185.24; 365/207; 365/225.7
[58] Field of Search ......................... 365/185.22, 185.21, 365/185.24, 207, 148, 225.7

[56] References Cited

U.S. PATENT DOCUMENTS

| | | | |
|---|---|---|---|
| 5,521,864 | 5/1996 | Kobayashi et al. | 365/185.22 |
| 5,568,419 | 10/1996 | Atsumi et al. | 365/185.22 X |
| 5,579,262 | 11/1996 | Song | 365/185.22 X |
| 5,629,892 | 5/1997 | Tang | 365/185.22 X |
| 5,642,309 | 6/1997 | Kim et al. | 365/185.22 |
| 5,684,741 | 11/1997 | Talreja | 365/185.22 |

FOREIGN PATENT DOCUMENTS 7-14393  1/1995  Japan .

Primary Examiner—Do Hyun Yoo
Attorney, Agent, or Firm—McDermott, Will & Emery

[57] ABSTRACT

In a confirmation operation of write data after writing data into a memory cell transistor (a verify operation), a verify potential generation circuit supplies a verify potential VPVRFY to the control gate of a memory transistor. Verify potential VPVRFY is determined depending upon the resistance ratio of variable resistors and a value of a constant current supplied from a constant current source circuit. According to reduction of a power supply potential, potential VPVRFY is decreased. The conductance of a memory cell transistor is adjusted according to variation in a detection sensitivity of a sense amplifier according to variation in the power supply potential, whereby the cell threshold value after a write operation takes a constant value.

12 Claims, 17 Drawing Sheets

FIG.13 PRIOR ART

|         | BIT LINE | CONTROL GATE | SOURCE LINE | SUBSTRATE |
|---------|----------|--------------|-------------|-----------|
| WRITE   | 5 V      | -8 V         | FLOATING    | 0 V       |
| ERASE   | FLOATING | 10 V         | -8 V        | -8 V      |
| READOUT | 1 V      | 3 V          | 0 V         | 0 V       |

NON-VOLATILE SEMICONDUCTOR MEMORY DEVICE HAVING LARGE MARGIN OF READOUT OPERATION FOR VARIATION IN EXTERNAL POWER SUPPLY VOLTAGE

BACKGROUND OF THE INVENTION

1. Field of the Invention

The present invention relates to non-volatile semiconductor memory devices, and particularly to a circuit configuration for effecting a confirmation operation of data read into a non-volatile memory cell. More particularly, the present invention relates to a non-volatile semiconductor memory device that can carry out stably a confirmation operation of write data into a non-volatile memory device even when power supply voltage is altered, and that allows a read out/write operation of high reliability.

2. Description of the Background Art

Development of a non-volatile semiconductor memory device such as flash memory is in progress so as to be replaced with a magnetic disc device conventionally used as an external storage device. Particularly in the field of portable computers, the demand for replacing hard disc devices and floppy disc devices which are conventional external storage devices is great.

In such cases, the requirement of low cost, low voltage, low power consumption, high speed rewriting, and high reliability must be satisfied.

FIG. 12 is a schematic cross sectional view of a floating gate type transistor forming a memory cell of a conventional non-volatile semiconductor device, wherein (a) and (b) show the cases of a write operation and an erase operation, respectively, for describing the potential of various elements.

Referring to FIG. 12, a memory cell transistor includes, for example, an n type drain region 502 and an n type source region 504 formed at a surface of a p type semiconductor substrate 500, a floating gate 506 formed on a channel region between drain and source regions 502 and 504 with a thin tunnel oxide film (for example, film thickness=10 nm) thereunder, and a control gate 508 provided on floating gate 506 with an insulator film thereunder.

A bit line BL is connected to drain region 502. Source region 504 selectively receives a predetermined potential via a source line SL (not shown), or is driven to a floating state.

The conductance across the source and drain varies according to the potential applied to the control gate. In the above-described structure, the channel conductance increases as the potential applied to the control gate increases in the positive direction. In other words, the current Ids flowing across the source and drain will increase by raising the potential of the control gate while a predetermined voltage is applied across the drain and source.

Here, the level of the control gate potential at which current Ids begins to flow across the source and drain is referred to as "cell threshold value".

This cell threshold value increases as electrons are charged into floating gate 506 attaining an electrically neutral state.

In other words, a current will not flow across the source and drain if a higher voltage is not applied to the control gate as the storage of electrons in floating gate 506 increases.

Since a floating gate is electrically isolated from the outside world by an insulator film, information is stored in a non-volatile manner by the stored electrons. Therefore, when a predetermined potential difference, for example 1V, is applied across the source and drain and a constant potential, for example 3V, is applied to control gate 508 in a state where data is written in a memory cell, the data written in the relevant memory cell will be identified according to whether or not current flows across the source and drain.

FIG. 13 shows examples of potentials applied to bit line BL, control gate 508, source line SL and substrate 500 in the respective cases of writing data, erasing data, and reading data with respect to the above-described memory cell.

A write operation and an erase operation will be described briefly hereinafter with reference to FIGS. 12(a) and 13.

[Write Operation]

Writing data into a memory cell is effected by drawing out electrons stored in floating gate 506.

Assuming that a power supply voltage Vcc is applied to control gate 508 in reading out data, the cell threshold value of a writing state is set to be at least 0V and not more than power supply voltage Vcc.

In general, the potential level of control gate 508 of a de-selected memory cell is maintained at 0V, and the potential level of control gate 508 of a selected memory cell is maintained at the level of power supply voltage Vcc. By setting the cell threshold value as described above, current will flow across the source and drain of the floating gate type transistor forming the memory cell that is selected when data is written in that memory cell.

In data writing, a potential of 5V, −8V, and 0V is applied to the bit line, the control gate, and the substrate, respectively, and source line SL is set at a floating state.

According to the above-described potential setting, electrons are withdrawn from floating gate 506 towards drain region 502. In other words, the cell threshold value is reduced.

[Erase Operation]

An erase operation will be described hereinafter with reference to FIGS. 12(b) and 13.

In an erase operation, bit line BL is set to a floating state, and a potential of 10V, −8V, and −8V is set for control gate 508, source line SL, and substrate 500, respectively.

In this case, electrons are injected towards control gate 508 biased positively from substrate 500, i.e. from the channel region, to floating gate 506.

In other words, the cell threshold value increases as electrons are stored in floating gate 506.

By setting the potential of bit line BL to 1V, the potential of control gate 508 to 3V, and the potentials of source line SL and substrate 500 to 0V in a readout operation, no current will flow across the source and drain when an erased memory cell is selected.

As described above, the cell threshold value can be altered by injecting or drawing out electrons to or from floating gate 506. By sensing whether a current flows in a selected memory cell in a readout operation, stored data can be read out.

[Programming Operation Towards Memory Cell]

In practice, writing data into a memory cell is generally carried out according to a procedure set forth in the following.

First, all the bits of memory cells of the block in which the memory cell to be written is present are set to an erase state, i.e. all the cell threshold values are set to a high state.

Then, a write operation is effected in a pulsive manner as described with reference to FIGS. 12 and 13 so that electrons are gradually drawn out from the floating gate of the memory cell transistor to which data is to be written. More specifically, following the draw out of electrons in a pulsive manner, the threshold value of the relevant memory cell transistor is verified (referred to as "program verify" hereinafter) to identify whether the threshold value attains a predetermined value.

By subsequently repeating the above-described writing and verification to gradually reduce the threshold value of the cell transistors, the write operation is completed when the cell threshold value of the memory cell having the slowest transition of a cell threshold value in the block for writing arrives at a set value.

Although the above-described procedure is only a way of example of a write procedure towards a memory cell, the above-described verification operation of a memory cell threshold value is indispensable to ensure data writing of high reliability.

Transition of the cell threshold value in writing data into a memory cell is shown in FIG. 14. In FIG. 14, the cell threshold value (represented as Vth hereinafter) is plotted along the abscissa, and the number of memory cells including a corresponding cell threshold value (referred to as number of bits hereinafter) is plotted along the ordinate.

First, an erase operation for a memory cell in the block carrying out data writing is effected, and the threshold value distribution thereof is shown in FIG. 14 as D1.

In order to verify whether all the memory cells in the block attain an erase state, a predetermined potential, i.e. a word line potential at an erasure verify operation, is applied to the word line to repeat the confirmation operation that there is no memory cell in the relevant block in which current flows and an erasure operation.

Then, a write operation is repeated in a pulsive manner, and the cell threshold value distribution of the block in a programming state is shown in FIG. 14 by D2.

In this case, a predetermined potential, i.e. a word line potential in program verify (expressed as VPVRFY hereinafter) is applied to the word line to verify that current does not flow in the memory cell to which data is to be written.

A data writing operation (programming operation, the verify operation of applying potential VPVRFY to a word line) must be carried out at high accuracy.

Consider the case where the transition of the cell threshold value becomes lower than the set value in the above-described program verify operation to result in distribution D3 shown in FIG. 14.

In this case, there are cells that has a minus cell threshold value (excessive write cell) at the foot of distribution D3.

The presence of such an excessive write cell becomes a fatal defect in the operation of a non-volatile semiconductor memory device such as a flash memory.

More specifically, when there is an excessive write cell on a bit line in reading out data of a memory cell on the same bit line, a cell of an erase state, i.e. an off state, is erroneously determined as an on state.

Since current will flow through the excessive write cell of a de-selected state, i.e. the excessive write cell having a control gate potential of 0V, an on state will be identified from the outside world even when a memory cell of a selected state attains an erase state, i.e. an off state.

FIG. 15 is a block diagram schematically showing a structure of memory cell transistors QC1 and QC2, and a sense amplifier 600 connected via bit line BL in a conventional flash memory.

For the sake of simplifying the description, a case where two memory cell transistors are connected to one bit line BL will be described.

It is assumed that both memory cell transistors QC1 and QC2 have their drains connected to bit line BL and sources coupled to ground potential.

A control gate CG1 of memory cell transistor QC1 is connected to a word line WL1. A control gate CG2 of memory cell transistor QC2 is connected to a word line WL2.

Bit line BL is connected to sense amplifier 600 via a transistor Q23 rendered conductive/non-conductive in response to a column select signal Y1.

As a basic structure, sense amplifier 600 includes a p channel MOS transistor Q28 that operates as a current source for applying a constant current to bit line BL, and an inversion circuit 606 receiving the potential level of the drain node of p channel MOS transistor Q28 (referred to as node A hereinafter) for providing read out data RD.

P channel MOS transistor Q28 has its source connected to power supply potential Vcc and its gate connected to ground potential Vss.

Sense amplifier 600 further includes a p channel MOS transistor Q29 operating as a current source, and having a source connected to power supply potential Vcc and a gate connected to ground potential Vss, an n channel MOS transistor Q26 connected between the drain of transistor Q29 and ground potential Vss, an n channel MOS transistor Q25 having a drain connected to node A, a source connected to the gate of n channel MOS transistor Q26 and to the drain of n channel MOS transistor Q23, and a gate connected to the drain of n channel MOS transistor Q26, and an n channel MOS transistor Q27 having a drain connected to power supply potential Vcc, a source connected to the gate of n channel MOS transistor Q26, and a gate connected to the gate of n channel MOS transistor Q25.

The connection node of n channel MOS transistor Q25 and n channel MOS transistor Q23 is referred to as node B hereinafter.

The operation of sense amplifier 600 will be described briefly hereinafter. When the potential level of node B is reduced, transistor Q26 is turned off. In response, the potential of transistor Q25 rises to increase the conductance of transistor Q25. As a result, the potential of node A is reduced according to the voltage drop by transistor Q28, and the output of inversion circuit 606 attains an H level. In contrast, when the potential level of node B is high, transistor Q26 is turned on. As a result, the gate potential of transistor Q25 is reduced, whereby transistor Q25 is turned off. Therefore, the potential level of node A increases, and the output of inversion circuit 606 attains an L level.

More specifically, readout data RD is output from inversion circuit 606 according to the potential level of node B.

For the sake of describing the disadvantage of a memory cell attaining an excessive write state, it is assumed that memory cell transistor QC1 attains an erase state, i.e. has a high cell threshold value, and memory cell transistor QC2 attains an excessive write state, i.e. has a negative cell threshold value.

Under the above-described state, it is assumed that memory cell transistor QC1 is selected, so that the potential level of word line WL1 attains the potential level of readout (generally, power supply potential Vcc), and memory cell transistor QC2 is de-selected, so that the potential level of word line WL2 is 0V.

When transistor Q23 is rendered conductive by column select signal Y1, the potential level of node B should attain an H level, and readout data RD from sense amplifier 600 should attain an L level since memory cell transistor QC1 essentially attains an erase state and is turned off.

However, the potential of node B actually decreases since de-selected memory cell transistor QC2 attains an excessive write state, and current flows therethrough even when the potential level of word line WL2 is 0V. Accordingly, the potential level of node A is driven to an L level, and readout data RD attains an H level.

In other words, the output of readout data RD which should really attain an L level is erroneously output as an H level.

It is therefore necessary to prevent generation of a memory cell of an excessive write state by carrying out program verify correctly in the series of program operation.

The word line potential during readout, i.e. power supply potential Vcc, is lowered to satisfy the requirement of operation at a low voltage with low power consumption. In order to prevent the above-described excessive writing, the cell threshold value of a memory cell attaining a write state must be at least 0V, as well as having sufficient margin with respect to the word line potential during readout.

Therefore, as shown in FIG. 14, word line potential VPVRFY in carrying out program verify and word line potential Vcc in a readout operation must have sufficient margin so as to prevent erroneous operation.

Since the potential applied to the word line in program verify, i.e. potential VPVRFY applied to the control gate, must be lowered than word line potential Vcc at readout, potential VPVRFY is generated by an internal voltage-down circuit within a non-volatile semiconductor memory device. The internal voltage-down circuit is designed so that potential VPVRFY has a constant value with respect to variation in external power supply voltage Vcc.

FIG. 16 is a block diagram schematically showing a conventional reference potential generation circuit 500, sense amplifier 600, and the main components in a memory cell array.

For the sake of simplification, only the portion related to memory cell transistor Q21 is depicted in FIG. 16.

The bit line has a hierarchical structure as set forth in the following in FIG. 16.

Main bit line BL is connected to sense amplifier 600 via column-select n channel MOS transistors Q23 and Q24 having the gate potential controlled by two bits of control signals Y1 and Y2, respectively.

Main bit line BL is connected to the drain of memory cell transistor Q21 via select gate transistor Q22 having a gate potential controlled by signal SG. The source potential of memory cell transistor Q21 is set to a predetermined level by source line SL.

The control gate of memory cell transistor Q21 is connected to word line WL. The potential level of word line WL is driven by a word line driver circuit 520 receiving verify potential VPVRFY generated from a verify voltage generation circuit 500. The above structure indicates only the main components carrying out a confirmation operation of data written into memory cell transistor Q21 (verify operation) after predetermined data is written into memory cell transistor Q21.

In a verify operation, column select gates Q23 and Q24 as well as select gate Q22 attain a conductive state.

In this state, word line driver circuit 520 sets the potential level of word line WL to the level of potential VPVRFY provided from verify voltage generation circuit. 500.

The potential level of source line SL is set to 0V. Sense amplifier 600 senses whether current flows through memory cell transistor Q21. Verification of data recorded in memory cell Q21 is carried out according to this result.

Since verify voltage generation circuit 500 is formed of a feedback type differential amplifier 20 receiving a constant reference potential VREF, the output potential VPVRFY is not dependent on the power supply voltage.

The fact that verify potential VPVRFY has no dependency on power supply voltage Vcc induces the following problem.

FIG. 17 is a diagram for describing an operation of sense amplifier 600 in a program verify operation when power supply potential Vcc is altered.

In FIG. 17, the source-drain voltage of a memory cell transistor and of a constant current source transistor Q28 in sense amplifier 600 is plotted along the abscissa, and the current flowing through a memory cell transistor and current source transistor Q28 is plotted along the ordinate.

Since potential VPVRFY applied to the control gate of a memory cell transistor in program verify has its value maintained at a constant level even when external power supply potential Vcc is shifted, the dependency of the current flowing through the memory cell transistor on the source-drain voltage does not change even when external power supply voltage Vcc is altered.

In contrast, the current supplied from the current source transistor p channel MOS transistor Q28 varies according to change in power supply potential Vcc.

In FIG. 17, the curve labeled $I_{CS2}$ indicates the dependency of the supply current of current source transistor Q28 on the source-drain voltage when power supply potential Vcc attains a typical level. The curve labeled $I_{CS1}$ shows the dependency of the drain current of current source p channel MOS transistor Q28 on the source-drain voltage when power supply potential Vcc attains the maximum level of the specification value.

The curve labeled $I_{CS3}$ indicates the dependency of the drain current of current source p channel MOS transistor Q28 on the source-drain voltage when power supply voltage Vcc attains the minimum level of the specification value.

In FIG. 17, the respective crossings points of curves $I_{CS1}$–$I_{CS3}$ and the curve of the cell current characteristic of the memory cell transistor indicates the potential level of node A of sense amplifier 600 shown in FIG. 15 when a constant verify potential VPVRFY is applied to the memory cell transistor.

For example, potential A' of the crossing point where power supply potential Vcc takes a maximum value is higher than the potential level of crossing point A where power supply potential Vcc takes a typical value.

This means that the inversion threshold value of inversion circuit 606 in sense amplifier 600 increases when power supply potential Vcc takes the maximum level of the specification value.

In other words, the value of the current flowing through the memory cell transistor must be greater when the power supply potential Vcc takes the maximum value than the case where power supply potential Vcc takes a typical value at the time point where the output level of inversion circuit 606 is inverted.

Therefore, when program verify is to be carried out in the case where power supply potential Vcc attains the maximum level of the specification value, the cell current value must be increased when potential VPVRFY is applied to the control gate of the memory cell. This means that the cell threshold value must further be reduced. A write operation is carried out until the cell threshold value reaches a lower level side according to repetition of a write operation and a program verify operation.

In contrast, when program verify is to be carried out in the case where power supply potential Vcc takes the minimum level of the specification value, the value of the current flowing through the memory cell can be lower than the case where power supply potential Vcc takes a typical value in order to have readout data RD from sense amplifier 600 inverted. In other words, the readout data from sense amplifier 600 can be inverted even if the cell threshold value is not reduced as low as the case where power supply potential Vcc takes the maximum value. Therefore, determination will be made that a write operation is completed at a higher cell threshold value in repeating a write operation and a program verify operation.

The relationship between power supply potential Vcc and the operation of data writing and program verify can be described also from the standpoint of channel conductance $g_c$ of a memory cell transistor.

FIG. 18 is a graph showing the relationship between potential $V_{CG}$ applied to the control gate and channel conductance $g_C$ for an erase state and a write state, wherein FIG. 18A shows the relationship when a write and program verify operation is carried out with power supply potential Vcc taking a typical value, and FIG. 18B shows the relationship of a write and program verify operation with power supply potential Vcc taking the minimum specification value.

Referring to FIG. 18A, the threshold voltage of a memory cell transistor is Vthe in an erase state. Channel conductance $g_C$ of the memory cell transistor increases as a potential higher than threshold value Vthe is applied to the control gate.

In this case, when the channel conductance of the memory cell transistor becomes greater than a predetermined value $g_t$ with respect to a constant current supplied from current source transistor p channel MOS transistor Q28, the potential of node A becomes so low that it is identified to attain an L level, and the output level of inversion circuit 600 shown in FIG. 16 attains an H level.

When channel conductance $g_C$ is lower than a predetermined threshold value $g_t$, the potential level of node A is identified to attain an H level, whereby an output of an L level is provided from inversion circuit 606.

If a program verify and write operation is carried out under such a state, a write operation is repeated until the $V_{cg}$-$g_C$ characteristic curve becomes a curve where the channel conductance is exactly $g_t$ when potential VPVRFY is applied to the control gate of the memory cell transistor, i.e. a curve where the threshold voltage is Vthp.

Assuming that a typical value of power supply potential Vcc is applied to the word line in reading out data from a memory cell following the above-described program operation, the difference between potential Vcc and threshold voltage Vthp becomes the margin of the cell threshold value.

As described above, an erroneous operation will be induced in a readout operation if a sufficient margin level is not ensured for this cell threshold value.

Referring to FIG. 18B, a case where a write operation and a program verify operation is carried out with power supply potential Vcc taking a minimum specification value will be described hereinafter.

Since the value of the current supplied from current source transistor p channel MOS transistor Q28 shown in FIG. 16 is reduced, the threshold value $g'_t$ of the channel conductance for the potential of node A to be identified as attaining an L level becomes lower than the case in FIG. 18A.

Therefore, the threshold voltage V'thp at the end of the write and program verify operation differs from that of FIG. 18A even when the threshold voltage of the memory cell transistor in an erase state is the same Vthe of FIG. 18A.

Since conductance $g'_t$ of the threshold value is decreased, the $V_{CG}$-$g_c$ characteristic curve shows a small transition from the curve in an erase state. In other words, the potential of node A is detected as attaining an L level when the control gate potential is VPVRFY even though threshold value V'thp is not lowered to the level of threshold value Vthp.

Thus, when a readout operation is to be carried out after a write and program verify operation is effected to have data written, the external power supply voltage is restored to the typical value, and the difference between potential Vcc and threshold voltage V'thp at a write state becomes smaller than that of FIG. 18A even when power supply potential Vcc applied to the control gate in data readout is identical to that of FIG. 18A. In other words, the margin of a cell threshold value is reduced in a data readout operation for a memory cell subjected to a write and program verify operation with power supply potential Vcc lower than a typical value.

Furthermore, the margin of the cell threshold value is further reduced when power supply potential Vcc takes the minimum specification value in data readout.

This means that the possibility of an erroneous operation increases in carrying out a readout operation after data is written in a non-volatile semiconductor memory device.

SUMMARY OF THE INVENTION

An object of the present invention is to provide a non-volatile semiconductor memory device that can have a sufficient margin of a cell threshold value ensured in readout even when an external power supply voltage is altered.

According to an aspect of the present invention, a non-volatile semiconductor memory device includes a memory cell array, a memory cell select circuit, a readout amplify circuit, and an internal control circuit.

The memory cell array includes a plurality of memory cells arranged in a matrix of rows and columns. The memory cell select circuit selectively carries out data readout/writing with a memory cell. Each memory cell includes first and second nodes and a control node. Each memory cell has the conductance between the first and second nodes varied according to the potential of the control node controlled by the memory cell select circuit, and has the conductance varied in a non-volatile manner according to data to be written when the potential of the control node attains a first potential. The readout amplify circuit operates upon receiving the first potential, and provides a signal according to a comparison result between the conductance of a corresponding memory cell and a detected threshold value according to the first potential. The internal control circuit selectively supplies a second potential to the control node of a corresponding memory cell to confirm data written into a corresponding memory cell according to an output of the read amplify circuit. The internal control circuit alters the second potential towards a decreasing direction of said conductance according to reduction in the detected threshold value that changes according to a value of the first potential.

According to another aspect of the present invention, a non-volatile semiconductor memory device includes a memory cell array, a plurality of word lines, a first internal voltage generation circuit, a bit line, a second internal voltage generation circuit, a data write circuit, a plurality of sense amplifiers, and a write control circuit.

The memory cell array includes a plurality of memory cells arranged in a matrix of rows and columns. The plurality of word lines are provided corresponding to the rows of the memory cell array. The first internal voltage generation circuit supplies a first potential according to an external power supply potential. Each memory cell includes first and second nodes, and a control node connected to a word line. Each memory cell has a conductance across first and second nodes varied according to a potential of the control node, and has a readout conductance where the potential of the control node attains the first potential varied in a non-volatile manner according to data to be written. The bit lines are provided corresponding to the columns of the memory cell array. Each bit line is connected to the first node of at least one memory cell. The second internal voltage generation circuit supplies a second potential. The data write circuit selects a corresponding word line and a bit line according to an externally applied address signal to write data with respect to a corresponding memory cell. The sense amplifier is connected to a corresponding memory cell via a bit line pair, and operates upon receiving the first potential to provide readout data according to a comparison result of a conductance of a memory cell and a detected threshold value according to the first potential. The write control circuit controls the data write circuit to repeat a write operation until the conductance of a corresponding memory cell becomes a data value corresponding to an external write data according to output of the sense amplifier when the second potential is selectively supplied to a corresponding word line. The second internal voltage generation circuit alters the second potential to a decreasing direction of the conductance of the memory cell according to reduction of the detected threshold value that changes according to the value of the first potential.

A main advantage of the present invention is to allow a correct confirmation operation of write data even when the detected threshold value is varied by virtue of altering the second potential applied to the control node of a memory cell in confirming data written into the memory cell according to variation in the detected threshold value of the readout amplify circuit by variation in the first potential level supplied to the readout amplify circuit.

Another advantage of the present invention is to allow a write operation into a memory cell with sufficient margin irrespective of variation in the first potential by virtue of altering the second potential applied to the control node of a memory cell in a write operation to the memory cell according to variation in the first potential level supplied to the sense amplifier.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 shows various potential levels in a write operation, an erase operation, and a readout operation of a conventional non-volatile semiconductor memory device.

FIGS. 18A and 18B are diagrams for describing an operation of power supply voltage dependency of a sense amplifier operation, wherein FIG. 18A shows the case where power supply voltage Vcc takes a typical value, and FIG. 18B shows the case where power supply voltage Vcc is lower than the typical value.

DESCRIPTION OF THE PREFERRED EMBODIMENTS

First Embodiment

Figure 1:
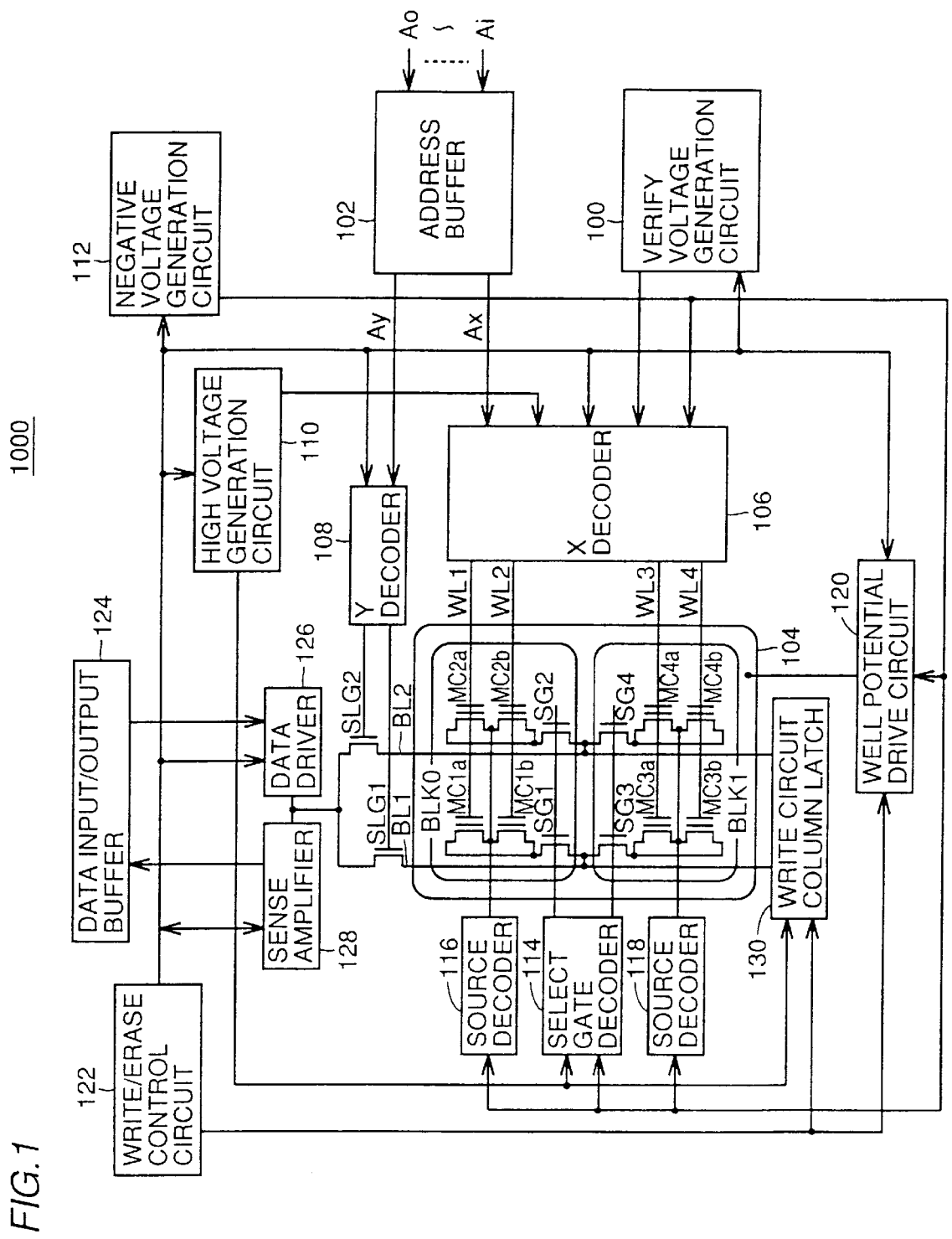
FIG. 1 is a block diagram schematically showing a structure of a non-volatile semiconductor memory device 1000 according to a first embodiment of the present invention.

Referring to FIG. 1, a non-volatile semiconductor memory device 1000 includes an address buffer 102 receiving external address signals Ao~Ai for providing a corresponding internal row address signal Ax and a corresponding internal column address signal Ay, a memory cell array 104 in which memory cells are arranged in rows and columns, an X decoder 106 receiving an internal row address signal Ax from address buffer 102 for selecting a corresponding row (word line) of memory cell array 104, and an Y decoder 108 receiving internal column address signal Ai from address buffer 102 for selecting a corresponding column of memory cell array 104.

Here, memory cell array 104 includes two memory cell array blocks BLK0 and BLK1. For the sake of simplification, one memory cell array block BLK0 or BLK1 in FIG. 1 includes four memory cell transistors. Memory cell array block BLK0 includes memory cell transistors MC1a and MC1b having their drains connected to a sub bit line SBL1, memory cell transistors MC2a and MC2b having their drains connected to a sub bit line SBL2, a select gate SG1 for opening/closing the connection between main bit line BL1 and sub bit line SBL1, and a select gate SG2 for opening/closing the connection between main bit line BL2 and sub bit line SBL2.

Memory cell transistors MC1a and MC2a have their control gates connected to word line WL1. Memory cell transistors MC1b and MC2b have their control gates connected to word line WL2.

Similarly, memory cell array block BLK1 includes memory cell transistors MC3a and MC3b having their drains connected to a sub bit line SBL3, and memory cell transistors MC4a and MC4b having their drains connected to a sub bit line SBL4.

Memory cell array block BLK1 further includes a select gate SG3 for opening/closing the connection between main bit line BL1 and sub bit line SBL3, and a select gate SG4 for opening/closing the connection between main bit line BL2 and sub bit line SBL4.

Memory cell transistors MC3a and MC4a have their control gates connected to word line WL3. Memory cell transistors MC3b and MC4 have their control gates connected to word line WL4.

X decoder 106 selects any of corresponding word lines WL1~WL4 according to internal row address signal Ax provided from address buffer 102.

Non-volatile semiconductor memory device 1000 further includes a high voltage generation circuit 110 receiving an external power supply voltage for generating a high voltage required in a data write operation or an erase operation of a memory cell, a negative voltage generation circuit 112 receiving external power supply voltage Vcc for generating a negative voltage required in a write or erase operation of a memory cell array, a select gate decoder 114 receiving outputs of high voltage generation circuit 110 and negative voltage generation circuit 112 for controlling the gate potential of corresponding select gates SG1~SG4 for connecting selectively a sub bit line and a main bit line, and a well potential drive circuit 120 receiving an output of negative voltage generation circuit 112 for controlling the well potential at the surface of a semiconductor substrate of a memory cell transistor.

X decoder 106 receives outputs of high voltage generation circuit 110 and negative voltage generation circuit 112 for supplying a predetermined negative voltage and a high voltage to a selected word line in a write operation and in an erase operation, respectively.

Non-volatile semiconductor memory device 1000 further includes a write/erase control circuit 122 for controlling a write operation and an erase operation of a memory cell, a data input/output buffer 124 for receiving externally applied data or data read out from a memory cell to provide the received data to an internal circuit or to the outside world, a data driver 126 receiving write data applied to data input/output buffer 124 for driving the potential of a corresponding bit line, a sense amplifier 128 for providing corresponding readout data according to stored information of a selected memory cell via bit line BL1 or BL2 in data readout, a write circuit 130 receiving write data from data driver 126 for supplying a high voltage from high voltage generation circuit 110 to a corresponding bit line, and a verify voltage generation circuit 100 for supplying verify potential VPVRFY to X decoder 106 in a verify operation.

Data driver 126 and sense amplifier 128 are connected to bit lines BL1 and BL2 via column select gates SOG1 and SOG2, respectively. The gate potentials of select gates SOG1 and SOG2 are controlled by Y decoder 108. Therefore, according to internal column address signal Ay from address buffer 102, a selected bit line is connected to sense amplifier 128 or data driver 126.

The reason why the bit line takes a hierarchical structure of a main bit line and a sub bit line in the above-described structure is set forth in the following.

When a structure is provided where memory cell transistors MC1a and MC1b in memory cell array block BLK0 and memory cell transistors MC3a and MC3b of memory cell array block BLK1 are connected simultaneously to one bit line BL1, a high voltage will be applied also to the drain of the memory cell transistor in a memory cell array block BLK1 even when data is to be written to a memory cell in memory cell array block BLK0. Therefore, the charge in the floating gate of the memory cell transistor in memory cell array block BLK1 will be altered during data writing to an adjacent memory cell array block BLK0. In the worst case, there is a possibility of the written data being altered.

In order to prevent the above problem, independent bit lines should be provided for every memory cell array block that carries out data writing. More specifically, a two layer structure of main bit lines BL1 and BL2 and sub bit lines SBL1~SBL4 is provided. The main bit lines connect all the memory cell array blocks, and sub bit lines SBL1~SBL4 connect the memory cell transistors within each memory cell array block.

Select gates SG1~SG4 are provided between main bit lines BL1, BL2 and sub bit lines SBL1~SBL4. In a writing operation, the memory cell array block that is not selected is electrically isolated from the main bit line by the select gate.

This prevents the memory cell transistor of a memory cell array block from being affected during rewriting of another memory cell array block.

However, the present invention is not limited to the above case where the bit line takes a hierarchical structure, as will become apparent from the following description, and can be applied to a general non-volatile semiconductor memory device.

An operation of non-volatile semiconductor memory device 1000 will described briefly hereinafter.

[Program Operation]

When data is to be written into a memory cell, address signals Ao~Ai specifying the address of a memory cell to be selected are applied to address buffer 102. The data to be written is applied to data input/output buffer 124. In response, data driver 126 drives the potential of a corresponding bit line. Write circuit 130 receives the write data from data driver 126 via bit line BL1.

It is assumed that the selected memory cells are MC1a and MC1b in memory cell array block BLK0. First, an erase operation for memory cell array MC1a and MC1b in memory cell array block BLK0 is carried out. More specifically, sub bit line SBL1 is driven to a floating state, and high voltage generation circuit 110 and negative voltage generation circuit 112 generate a predetermined high voltage and negative voltage, respectively, under control of write/erase control circuit 122. In response, source decoder 116 sets the source potentials of memory cell transistors MC1a and MC1b in memory cell array block BLK0 to a predetermined negative potential via source line SL1. Well potential generation circuit 120 sets the well potential of the memory cell transistor to a negative potential (for example, -8V) identical to the source potential of the memory cell transistor.

X decoder 106 is controlled by write/erase control circuit 122 to supply the high voltage (for example, 10V) provided from high voltage generation circuit 110 to word lines WL1 and WL2.

As a result, electrons are injected from the substrate side to the floating gates of memory cell transistors MC1a and MC1b, whereby the threshold value of these memory cell transistors rises.

Write circuit 130 is controlled by write/erase control circuit 122 to drive the potential level of bit line BL1 in a pulsive manner thereafter. More specifically, when data is to be written only to memory cell MC1a, source decoder 116 sets source line SL1 to a floating state. Well potential drive circuit 120 is controlled by write/erase control circuit 122 to set the well potential to 0V, for example. X decoder 106 is controlled by write/erase control circuit 122 to supply the negative voltage (for example, -8V) applied from negative voltage generation circuit 112 to word line WL1. Write circuit 130 is controlled by write/erase control circuit 122 to set the level of bit line BL1 to a predetermined high voltage, (for example, 5V) according to the high voltage provided from high voltage generation circuit 110.

By applying the potential to memory cell transistor MC1a in a pulsive manner, electrons are drawn out from the floating gate, whereby the threshold voltage of memory cell transistor MC1a is altered.

At the end of one pulse apply operation, non-volatile semiconductor memory device 1000 is controlled by write/erase control circuit 122 to carry out a program verify operation set forth in the following. More specifically, column select gate SLG1 is rendered conductive, whereby sense amplifier 128 and bit line BL1 are connected. The source and well potentials of memory cell transistor MC1a are both maintained at the level of 0V by source decoder 116 and well potential drive circuit 120, respectively. X decoder 106 receives the output potential from verify voltage generation circuit 100 to supply this potential to word line WL1. Select gate SG1 is rendered conductive by select gate decoder 114, so that sense amplifier 128 is connected to the drain of memory cell transistor MC1a by main bit line BL1, select gate SG1, and sub bit line SBL1. Write/erase control circuit 122 receives readout data from sense amplifier 128 to confirm the data written into memory cell MC1a.

If write/erase control circuit 122 determines that a data writing operation into memory cell transistor MC1a is not completed, a pulse potential is applied again for writing data into memory cell transistor MC1a, and a program verify operation is carried out thereafter.

Application of a write pulse and a program verify operation are repeated until the threshold voltage of memory cell transistor MC1a arrives at a level corresponding to the data to be written while the potential level of word line WL1 attains the level of potential VPVRFY supplied from verify voltage generation circuit 100.

Thus, predetermined data is written into a selected memory cell MC1a.

Figure 2:
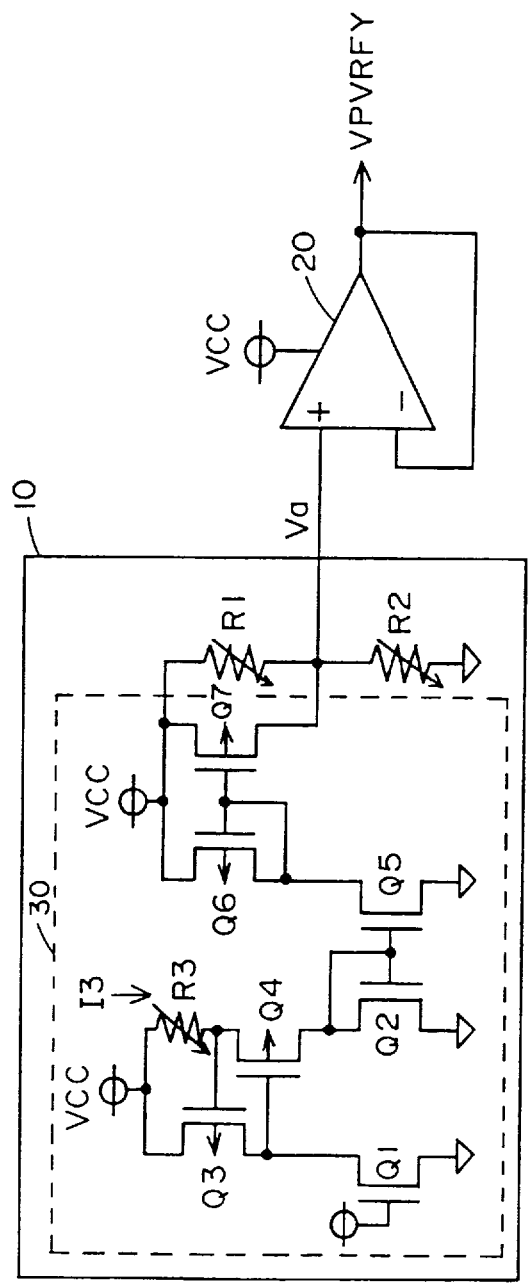
FIG. 2 is a block diagram schematically showing a verify voltage generation circuit 100 of non-volatile semiconductor memory device 1000.

FIG. 2 is a block diagram schematically showing a structure of verify voltage generation circuit 100 according to the first embodiment of the present invention.

Verify voltage generation circuit 100 includes a reference potential generation circuit 10, and a differential amplifier 20 receiving reference potential Va provided from reference potential generation circuit 10 at one input to output program verify potential VPVRFY. The output node of differential amplifier 20 is connected to the second input node thereof so that a negative feedback is applied to differential amplifier 20.

Reference potential generation circuit 10 includes a variable resistor R1 connected between external power supply potential Vcc and the output node of reference potential generation circuit 10, a variable resistor R2 connected between the output node of reference potential generation circuit 10 and the ground potential, and a constant current source 30 for supplying a predetermined constant current to variable resistor R2.

Constant current source 30 includes a variable resistor R3 having one end connected to power supply potential Vcc, a p channel MOS transistor Q3 having a source connected to power supply potential Vcc and a gate connected to the other end of variable resistor R3, a p channel MOS transistor Q4 having a source connected to the other end of variable resistor 3 and a gate connected to the drain of p channel MOS transistor Q3, an n channel MOS transistor Q1 receiving power supply potential Vcc at its gate, and connected between the drain of p channel MOS transistor Q3 and the ground potential, and an n channel MOS transistor Q2 having a drain connected to the drain of p channel MOS transistor Q4, a source connected to the ground potential, and the drain and gate connected to each other.

Constant current source circuit 30 further includes an n channel MOS transistor Q5 having a source connected to ground potential, and a gate connected to the gate of n channel MOS transistor Q2, a p channel MOS transistor Q6 having a source and a drain connected to power supply potential Vcc and the drain of n channel MOS transistor Q5, respectively, and the gate and drain connected to each other, and a p channel MOS transistor Q7 having a source connected to power supply potential Vcc, a drain connected to the connection node of variable resistors R1 and R2, and a gate connected to the gate of p channel MOS transistor Q6.

An operation of verify voltage generation circuit 100 will be described hereinafter.

P channel MOS transistor Q3 can operate in a subthreshold region by setting the resistance of variable resistor R3 to a predetermined value. Here, the potential difference between the source and gate of p channel MOS transistor Q3 becomes the threshold voltage VQ3th of p channel MOS transistor Q3. Since the voltage applied across variable resistor R3 also attains this level of threshold voltage VQ3th, current I3 flowing through variable resistor R3 is represented by the following equation.

$$I3 = VQ3th/R3 \quad (1)$$

Therefore, the current flowing through transistors Q4 and Q2 is fixed to current value I3.

Since transistors Q2 and Q5 form a current mirror circuit, the current flowing to transistor Q5, i.e., the current flowing to transistor Q6, is fixed to current value I3.

Since transistors Q6 and Q7 also form a current mirror circuit, the current flowing to transistor Q7 is fixed to current value I3.

Therefore, constant current I3 from transistor Q7 is supplied to variable resistor R3.

Assuming that the current flowing to variable resistor R1 is represented by I1, the relationship between the potential of the node of variable resistors R1 and R2, i.e. the reference potential Va supplied to differential amplifier 20, and currents I1 and I3 is expressed by the following equation.

$$Vcc = R1 \cdot I1 + R2 \cdot (I1 + I3) \quad (2)$$

$$Va = R2 \cdot (I1 + I3) \quad (3)$$

By deleting I1 and I3 from equations (1), (2) and (3), reference potential Va is:

$$Va = [R2 \cdot Vcc + R1 \cdot R2 \cdot VQ3th/R3]/[R1 + R2) \quad (4)$$

represented by R1, R2, R3, Vcc and VQ3th.

Differential amplifier 20 receives the above-described reference potential Va at its plus input node, and has its output node connected to its minus input node. Therefore, differential amplifier 20 operates as an amplifier of gain 1, and provides program verify potential VPVRFY having a sufficient current driving capability on the basis of reference potential Va.

More specifically, program verify potential VPVRFY is expressed by the following equation in its operation region.

$$VPVRFY = [R2 \cdot Vcc + R1 \cdot R2 \cdot VQ3th/R3]/(R1 + R2) \quad (5)$$

Figure 3:
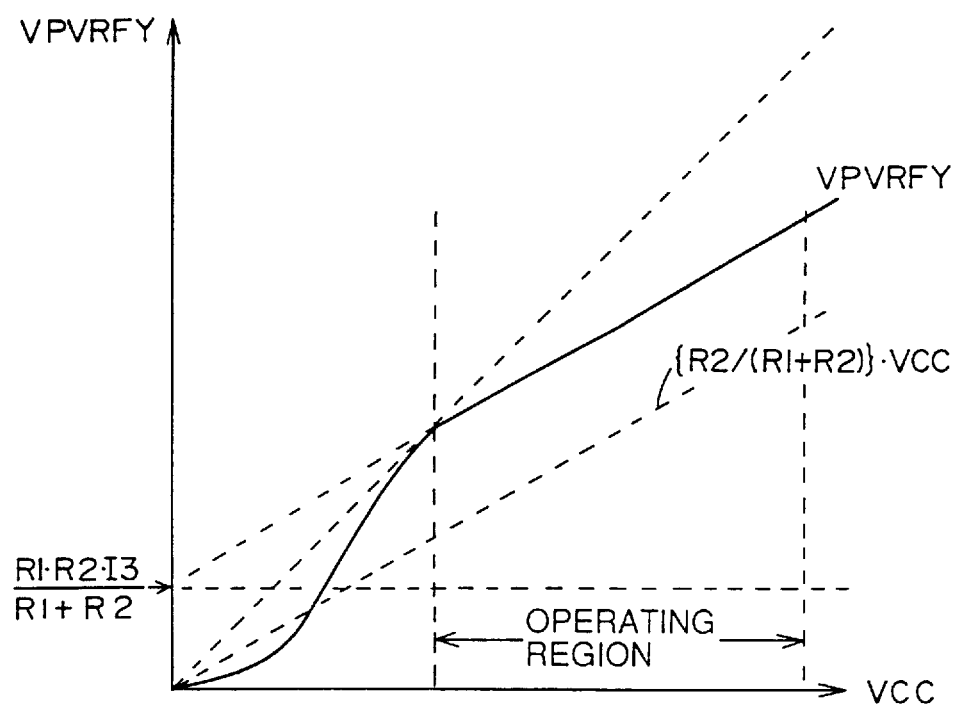
FIG. 3 is a diagram for describing an operation of verify voltage generation circuit 100.

FIG. 3 is a graph showing the dependency of program verify potential VPVRFY shown by equation (5) on power supply potential Vcc.

In an operation region, program verify potential VPVRFY has a gradient of k=R2/(R1+R2) with respect to power supply potential Vcc, and has a dependency represented by the linear function of:

$$a = R1 \cdot R2 \cdot VQ3th/[R3 \cdot (R1 + R2)]$$

Figure 18A:
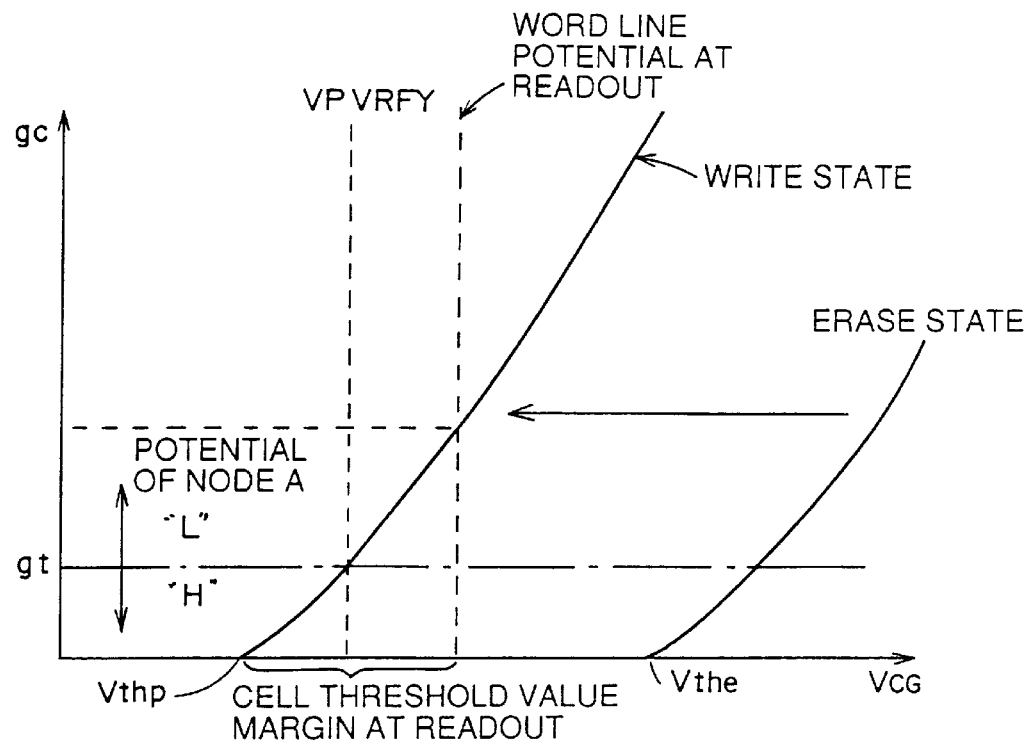

As described with reference to FIG. 18, when a sense amplifier reads out data stored in a corresponding memory cell, detected threshold value $g_t$ with respect to the conductance of the memory cell in detecting whether the stored data is 1 or 0 is altered according to power supply potential Vcc. The detected threshold value with respect to this memory cell conductance decreases as power supply potential Vcc is lowered.

Therefore, the verify potential applied to the control gate of the memory cell transistor, i.e. the word line, in a program verify operation must be lowered when power supply potential Vcc is reduced.

Figure 18B:
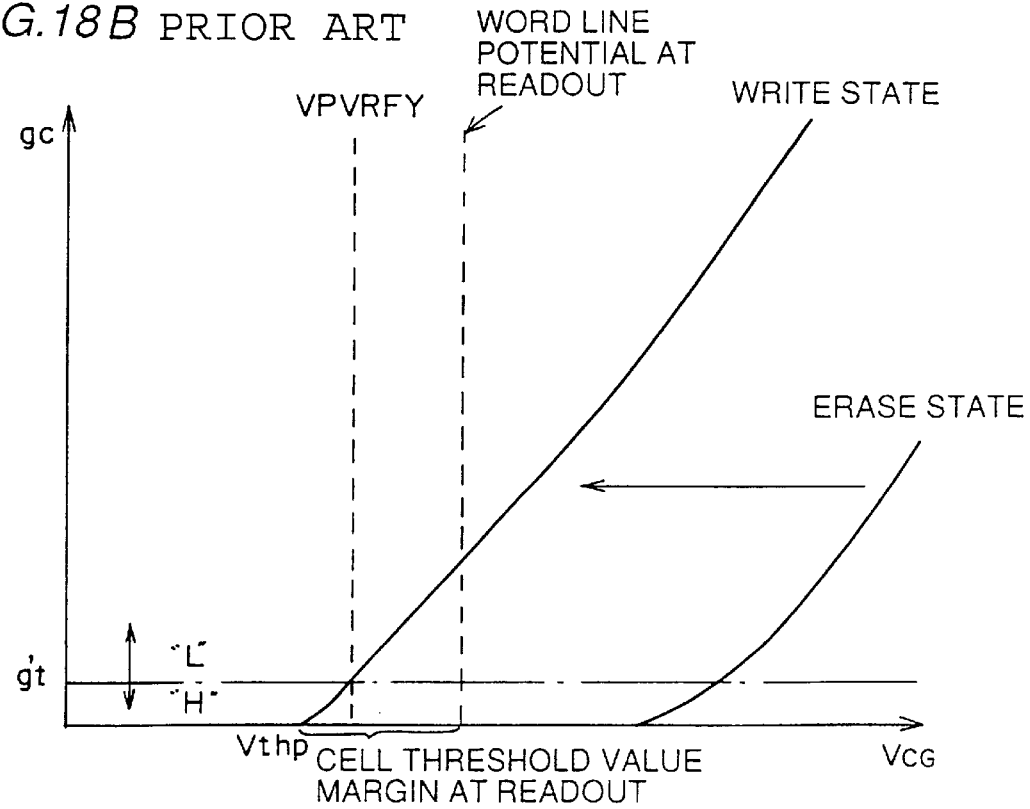

This corresponds to the operation shown in FIG. 18(B) where program verify potential VPVRFY is lowered to decrease threshold value V'thp of the memory cell transistor of a write state and increasing the margin of the cell threshold value in a readout operation.

In other words, resistance values R1, R2 and R3 can be selected so that the dependency of program verify potential VPVRFY shown in FIG. 3 on power supply potential Vcc corresponds to change in the detected threshold value of the sense amplifier.

Figure 4:
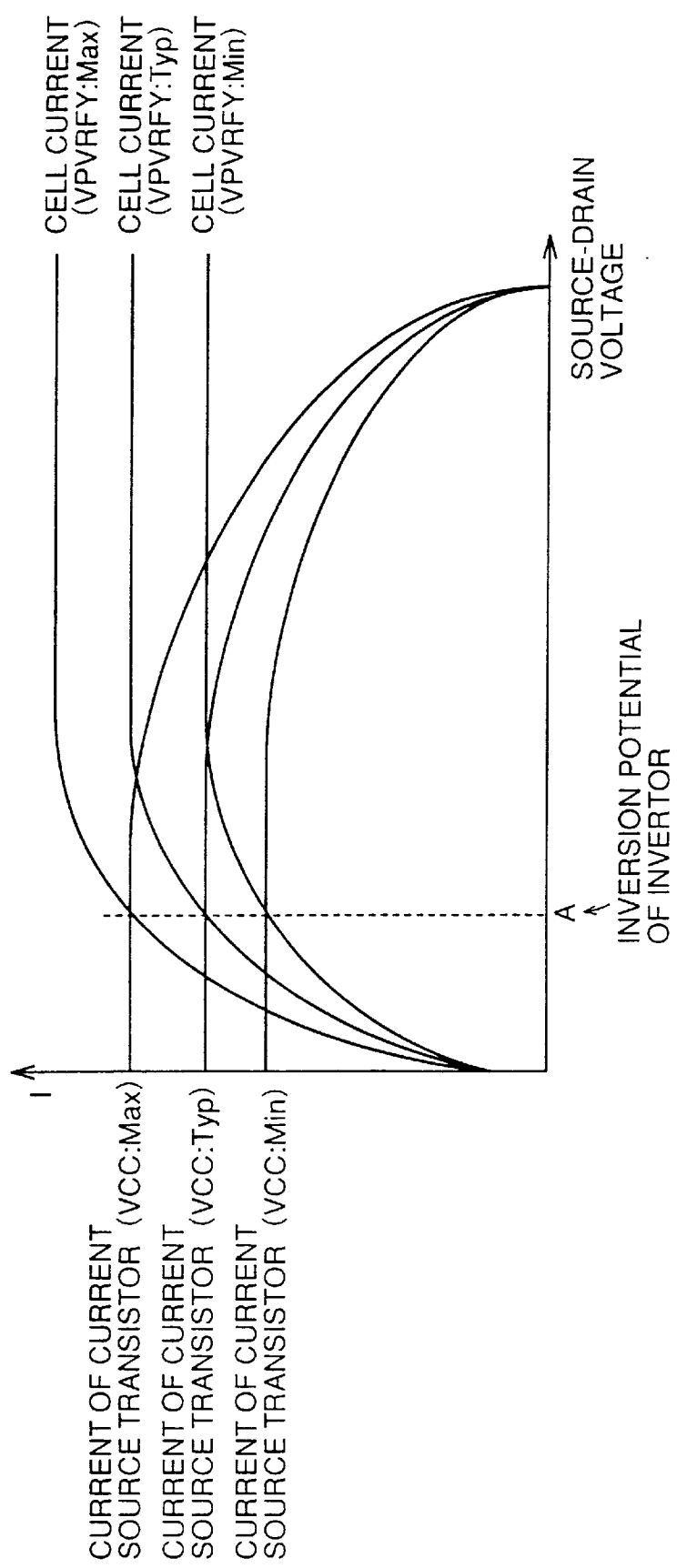
FIG. 4 is a diagram for describing an operation of a sense amplifier in the non-volatile semiconductor memory device of the first embodiment.
Figure 15:
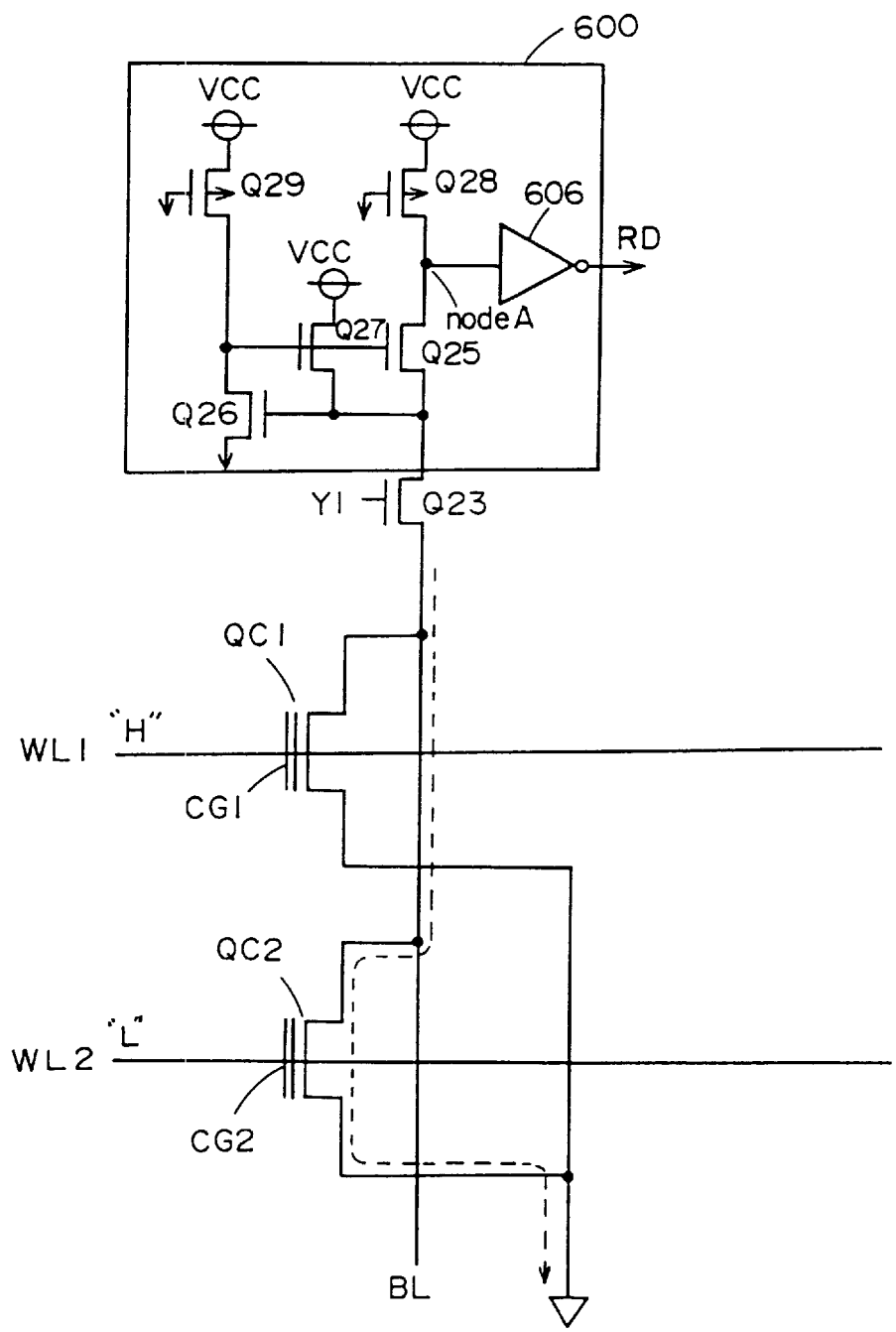
FIG. 15 is a circuit diagram of main components of a conventional non-volatile semiconductor memory device.
Figure 16:
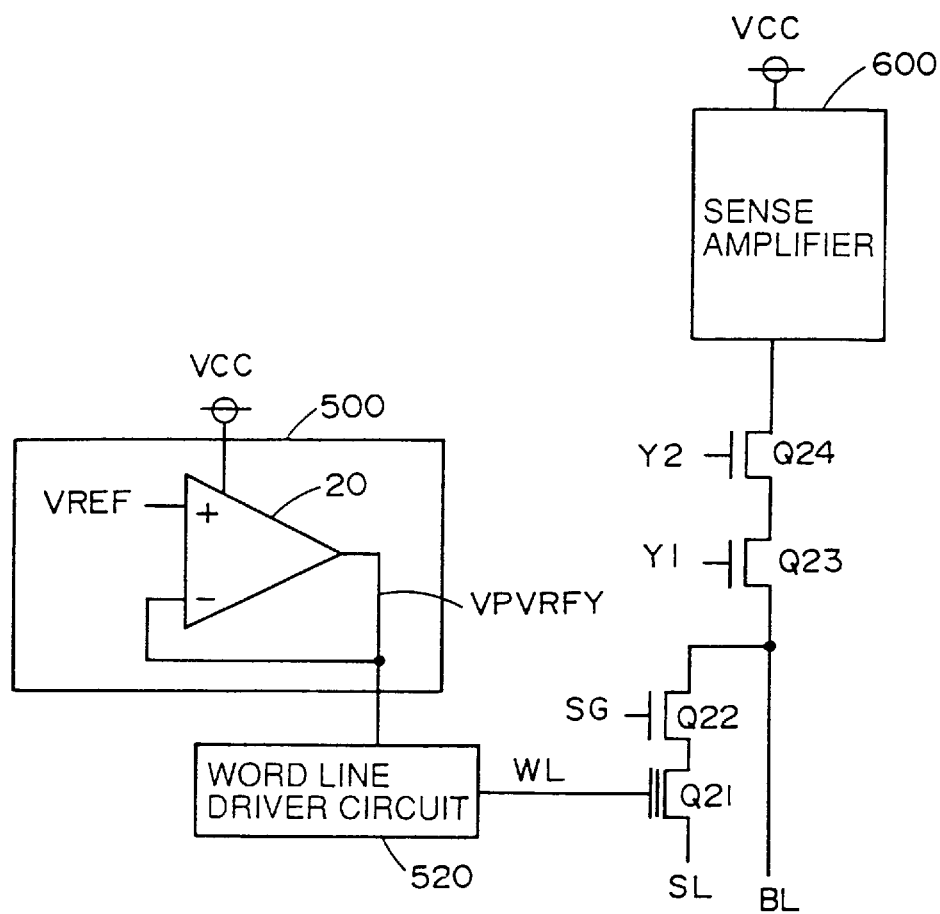
FIG. 16 is a circuit diagram of main components including verify voltage generation circuit 500 of a conventional non-volatile semiconductor memory device.
Figure 17:
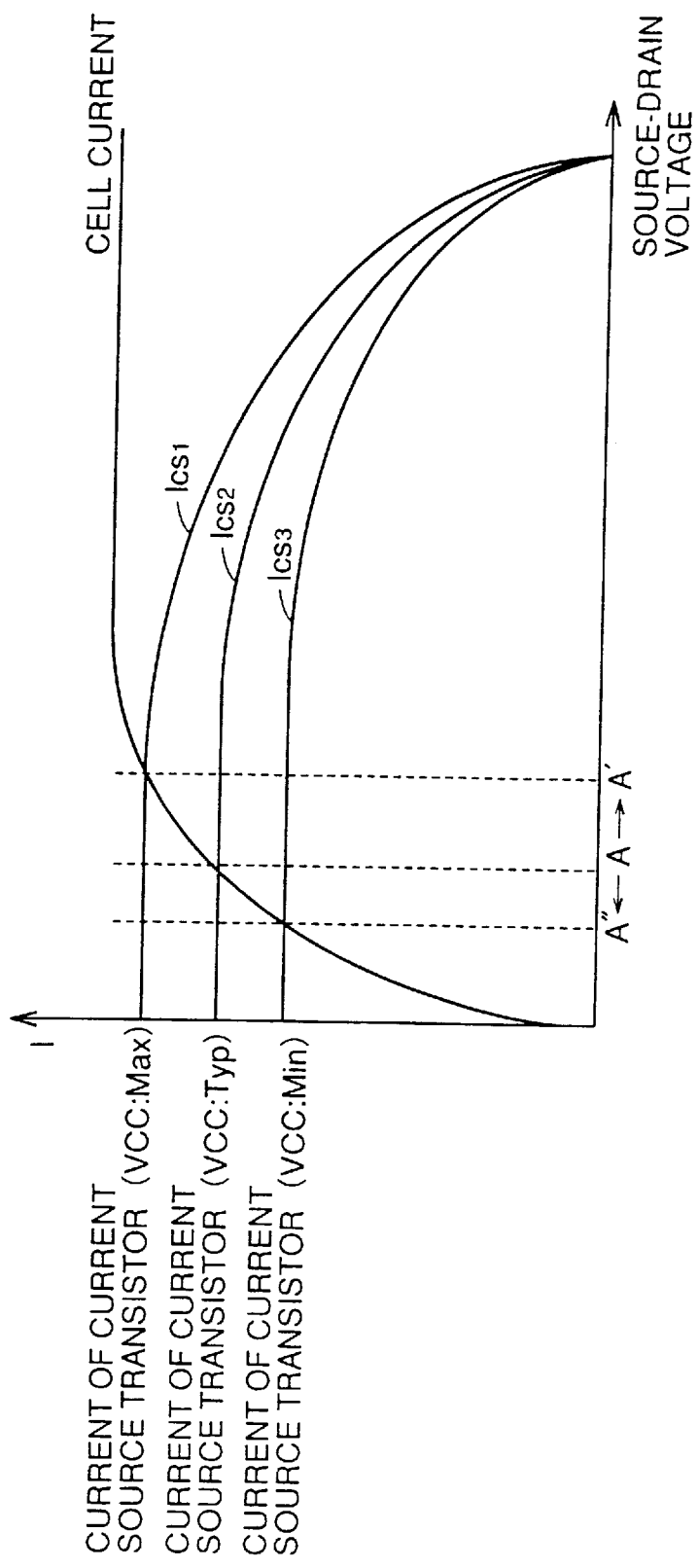
FIG. 17 is a diagram for describing an operation of a sense amplifier of a conventional non-volatile semiconductor memory device.

FIG. 4 is comparable to FIG. 17, and shows the relationship between the source-drain voltage and the drain current of constant current source transistor p channel MOS transistor Q8 in sense amplifier 600 shown in FIG. 15 and the memory cell transistor when program verify potential VPVRFY is altered with a predetermined dependency according to change in power supply potential Vcc.

It is appreciated from FIG. 17 that, since program verify potential VPVRFY applied to the control gate of the memory cell transistor is constant during a program verify operation, change in the current supply capability of constant current source transistor p channel MOS transistor Q8 according to variation in power supply potential Vcc causes the balanced point of the current flowing through the memory cell transistor and the current flowing through current source transistor Q28 to be shifted independent of the logic threshold value of the inverter of the next stage. More specifically, the potential level of node A in sense amplifier 600 shown in FIG. 15 is altered according to a change in external power supply potential Vcc, whereby the detection sensitivity (detected threshold value) of the sense amplifier is altered.

In program verify voltage generation circuit 100 according to the first embodiment of the present invention shown in FIG. 4, program verify potential VPVRFY is lowered according to reduction of power supply voltage Vcc with a predetermined dependency.

Therefore, a change in the current supply capability of current source transistor p channel MOS transistor Q28 in sense amplifier 600 shown in FIG. 15 in response to change in power supply potential Vcc causes the current that can flow to the memory cell transistor to be altered. Therefore, the detection sensitivity of sense amplifier 600 (detected threshold value) will not change even when power supply voltage Vcc is altered.

Figure 5:
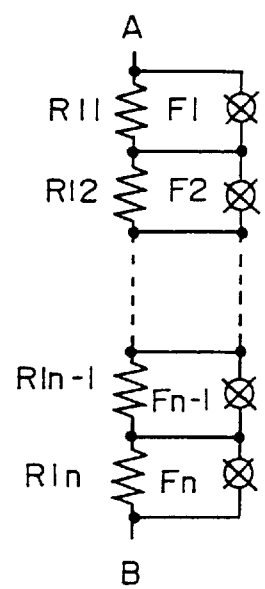
FIGS. 5, 6 and 7 are circuit diagrams showing examples of variable resistance in verify voltage generation circuit 100.

FIG. 5 shows an example of a structure of variable resistor R1 of FIG. 2.

Variable resistor R1 includes node A to which power supply potential Vcc is supplied, and resistors R11, R12, . . . R1n-1, R1n connected in series between node A to which power supply potential Vcc is supplied and node B from which reference potential Va is supplied.

Variable resistor R1 further includes fuse elements F1~Fn connected in parallel to each of resistors R11~R1n.

By blowing out fuse elements F1~Fn to attain a predetermined value, the resistance of variable resistor R1 can be set to a desired value.

An identical structure can be provided for variable resistors R2 and R2.

Figure 6:
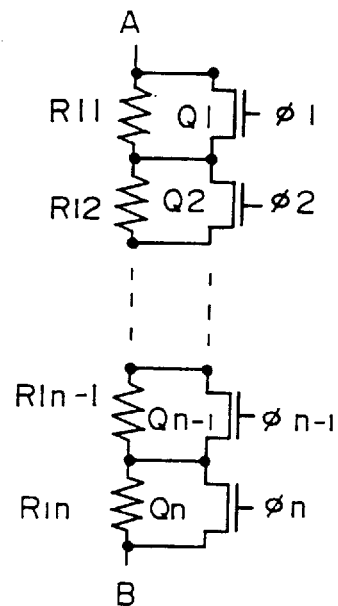

FIG. 6 is a circuit diagram showing another example of variable resistor R1.

Variable resistor R1 of FIG. 6 includes resistors R11~R1n connected in series between node A to which power supply potential Vcc is supplied and node B from which reference potential Va is supplied, and n channel MOS transistors Q1~Qn connected in parallel to each of resistors R11~R1n.

N channel MOS transistors Q1~Qn are controlled by signals φ1~φn to be opened/closed.

Signals φ1~φn output from write/erase control circuit 122 shown in FIG. 1 render n channel MOS transistors Q1~Qn respectively conductive or non-conductive to set a predetermined resistance. For example, the value of variable resistor R1 can be set by providing a structure including a memory that stores respective levels of signals φ1~φn in a non-volatile manner in write/erase control circuit 122.

A similar structure can be provided for variable resistors R2 and R3.

Figure 7:
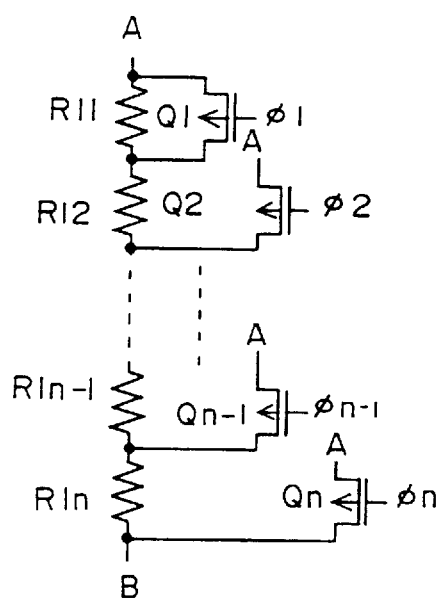

FIG. 7 shows another example of variable resistor R1 of FIG. 2.

Variable resistor R1 of FIG. 7 includes resistors R11~R1n connected in series between node A to which power supply potential Vcc is supplied and node B from which reference potential Va is supplied, and p channel MOS transistors Q1~Qn having their sources and drains connected between respective connection nodes of resistors R11~R1n and node A, and having a gate potential controlled by control signals φ1~φn.

By controlling the conductive/non-conductive states of p channel MOS transistors Q1~Qn by control signals φ1~φn provided from write/erase control circuit 122 shown in FIG. 1, variable resistor R1 can be set to a predetermined value.

Similar to the case of FIG. 6, control of the potential levels of signals $\phi1\sim\phi n$ can be provided according to stored data in a non-volatile memory in write/erase control circuit 122.

An identical structure can be provided for variable resistors R2 and R3.

Figure 8:
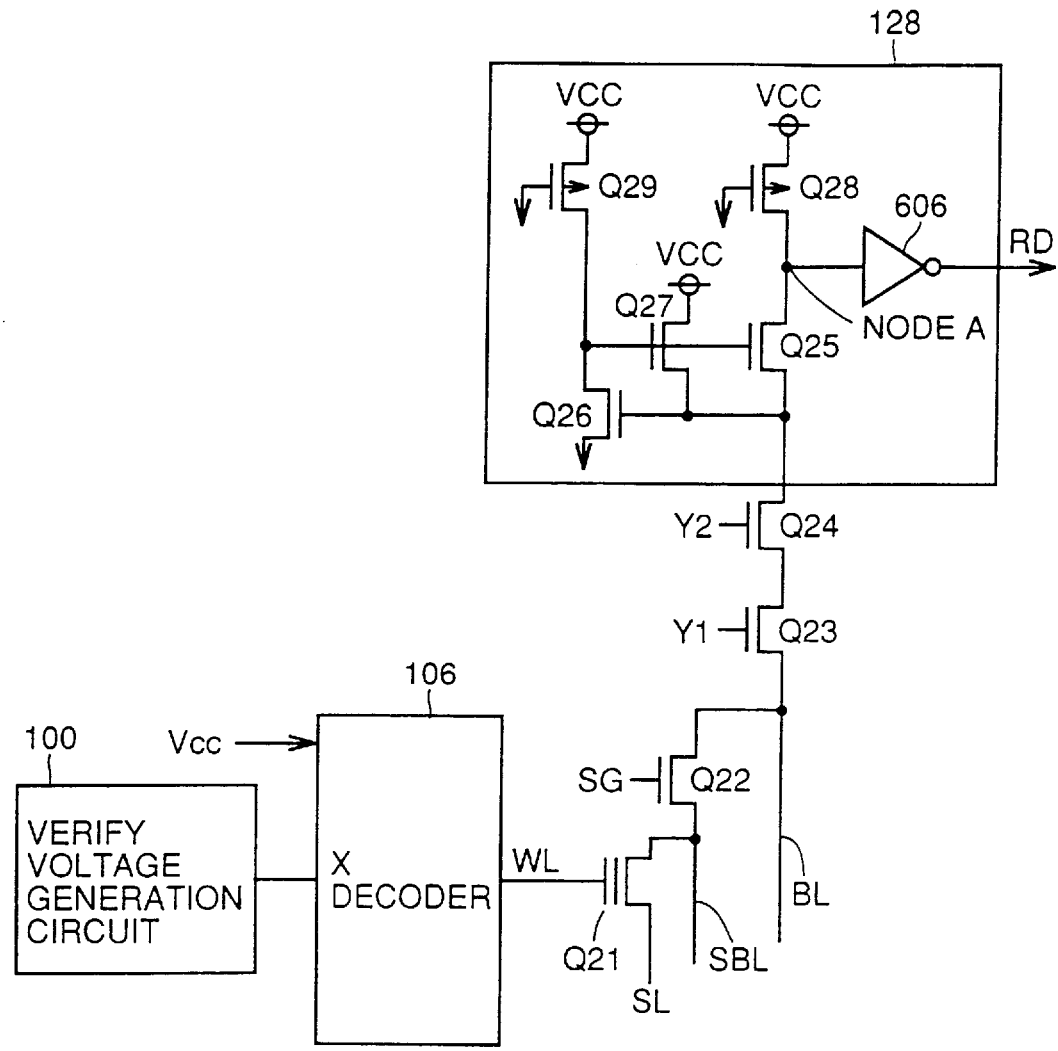
FIG. 8 is a circuit diagram of main components of non-volatile semiconductor memory device 1000.

FIG. 8 is a block diagram schematically showing main components of sense amplifier 128, X decoder 106, verify voltage generation circuit 100, and memory cell array 104 of FIG. 1.

The structure of sense amplifier 128 is similar to that of sense amplifier 600 shown in FIG. 15. Corresponding components have the same reference characters allotted, and their description will not be repeated.

In FIG. 8, sense amplifier 128 and main bit line BL are connected via column select gate transistors Q23 and Q24 controlled by two bits of signals Y1 and Y2.

For the sake of simplification, it is assumed that only one memory cell transistor Q21 is included in a memory cell.

Main bit line BL and sub bit line SBL are connected via select gate transistor Q22. Transistor Q22 has its gate potential controlled by signal SG from a segment gate decoder 114 to attain a conductive state when the memory cell connected to sub bit line SBL is selected.

Memory cell transistor Q21 has its drain connected to select gate transistor Q22 via sub bit line SBL. A predetermined potential is selectively applied to the source of memory cell transistor Q21 by source line SL.

Memory cell transistor Q21 has its control gate connected to word line WL. The potential level of word line WL is controlled by X decoder 106.

Particularly, program verify potential VPVRFY supplied from verify voltage generation circuit 100 is supplied to word line WL selected by X decoder 106 during a program verify operation.

The operation of verify voltage generation circuit 100 and the select operation of X decoder 106 are controlled by write/erase control circuit 122 of FIG. 1.

Similar to the prior art shown in FIG. 15, inversion circuit 606 provides readout data RD according to the potential level of the drain node of p channel MOS transistor Q28 that supplies a current, i.e. node A. The potential level of node A varies according to whether memory cell transistor Q21 is rendered conductive or non-conductive when a potential of a predetermined level is applied to word line WL. Change in the potential level of node A is output as readout data RD.

Figure 9:
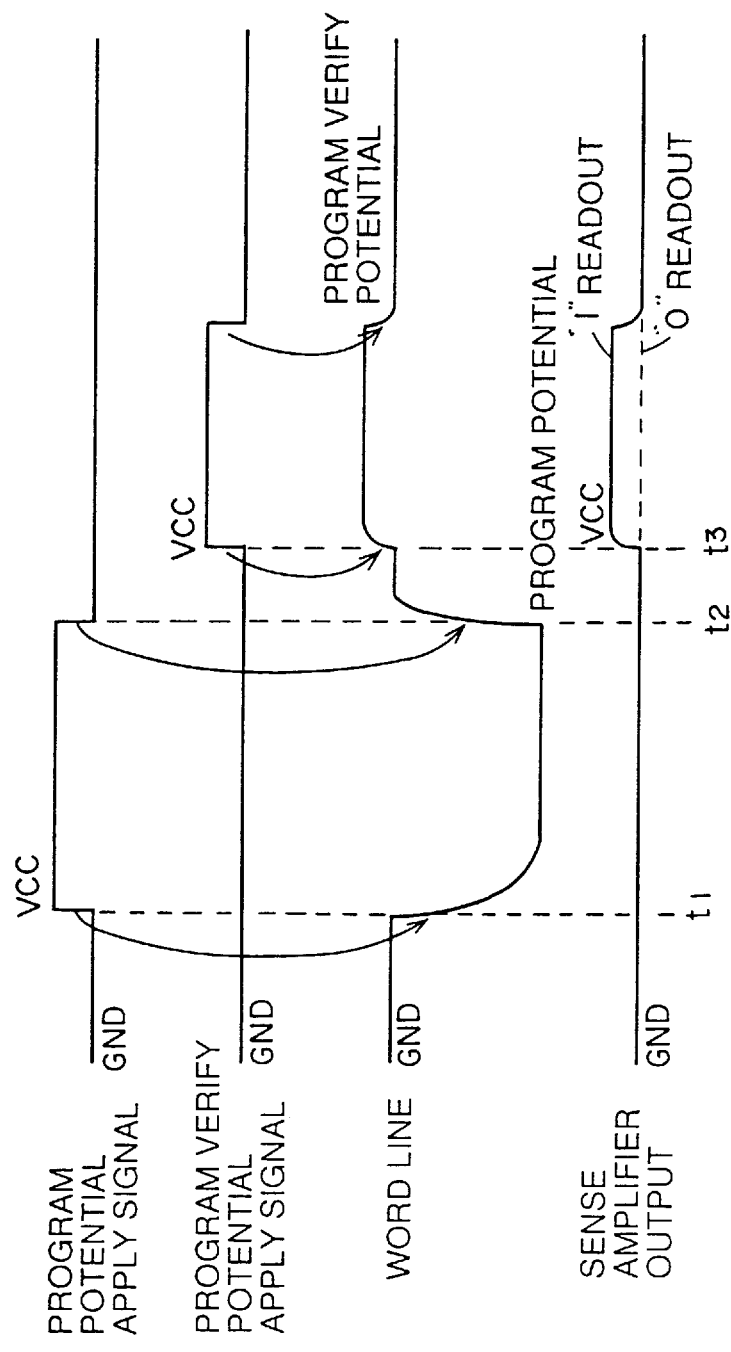
FIG. 9 is a timing chart for describing an operation of non-volatile semiconductor memory device 1000.

FIG. 9 is a timing chart showing the transition of main signals overtime in a write operation and a verify operation of the circuitry shown in FIG. 8.

At time t1, the program potential apply signal provided from write/erase control circuit 122 attains an active level (potential level Vcc). In response, X decoder 106 provides a negative potential (for example, −8V) provided from negative voltage generation circuit 112 to a selected word line WL. Here, a predetermined potential (for example 5V) is applied to main bit line BL from a write circuit (column latch). Source line SL is maintained at a floating state, and the substrate potential is maintained at 0V.

Therefore, electrons are drawn out from the floating gate of the memory cell transistor to a bit line, and the cell threshold value of the selected memory cell transistor is reduced. At time t2, the program potential apply signal is driven to an L level (ground potential GND), and X decoder 106 inhibits its application of a voltage to word line WL.

At time t3, the program verify potential apply signal from write/erase control circuit 122 attains an H level, and a predetermined program verify potential VPVRFY is provided from verify potential generation circuit 100. X decoder 106 receives an output potential of verify potential generation circuit 100 and provides the potential to selected word line WL.

Here, column select gates Q23 and Q24 of bit line BL corresponding to the selected memory cell both attain a conductive state, and the current from current source transistor Q28 in sense amplifier 128 is supplied to the drain of memory cell transistor Q1. If the cell threshold value of memory cell transistor Q21 is low enough and the conductance of the memory cell transistor when the program verify potential is applied to the control gate is great enough in the write operation at time t1~t2, the potential level of node A in sense amplifier 121 is reduced, and level 1 is read out as readout data RD.

If the threshold value transition of the memory cell transistor is insufficient, and the conductance while program verify voltage VPVRFY is applied to the control gate of memory cell transistor Q21 is lower than the threshold value in the write operation at time t1~t2, the potential level of node A in sense amplifier 128 is not reduced, and level 0 is output as readout data RD.

When 1 is output as the readout data, write/erase control circuit 122 determines that the writing operation for the selected memory cell is completed.

When level 0 is output as the readout data, write/erase control circuit 122 determines that a write operation is not completed, and a write operation is carried out again for the selected memory cell transistor Q21.

In verify potential generation circuit 100 of the first embodiment, program verify potential VPVRFY is altered according to a change in power supply voltage Vcc. Therefore, a change in the detected threshold value with respect to the conductance of the memory cell transistor by sense amplifier 128 in response to change in power supply voltage Vcc causes variation in the detected level of readout data RD. It is therefore possible to alter the threshold value of memory cell transistor Q1 to a voltage level having a sufficient readout margin with respect to the potential level of the word line in a readout operation even when power supply potential Vcc is reduced.

The values of the potentials and combination thereof applied to the word line, the bit line, the source line, and the substrate in the above-described write operation are only a way of example, and will vary depending upon the characteristics of the transistors and structure of the readout and write circuits.

In the above embodiment, a write state (stored state of 1) was assumed when the cell threshold value of the memory cell transistor is at least 0V and not more than the potential level of the word line in readout. A circuit configuration is allowed wherein the same state is an erase state (stored state of 0). In this case, a structure can be provided wherein the combination of the potential levels of various portions of the memory cell transistor in a write operation is replaced with the combination of the potential level in an erase state.

Second Embodiment

Figure 10:
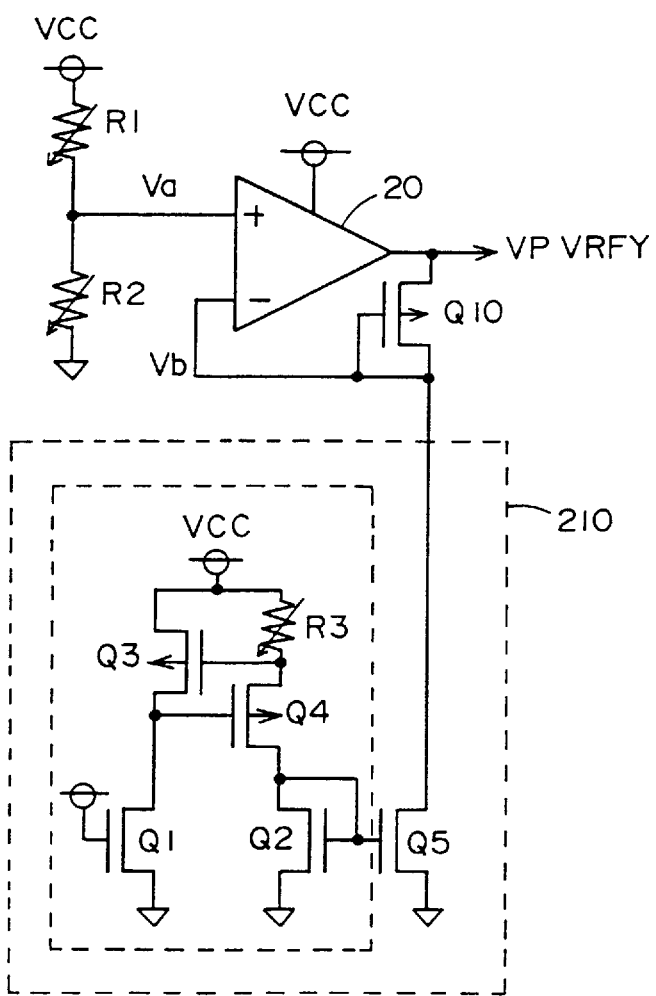
FIG. 10 is a block diagram schematically showing a structure of a verify voltage generation circuit 200 according to a second embodiment of the present invention.

Referring to FIG. 10, a program verify potential generation circuit 200 according to a second embodiment of the present invention includes variable resistors R1 and R2 connected in series between a node to which power supply potential Vcc is supplied and a node to which ground potential GND is supplied, a differential amplify circuit 20 for receiving potential Va of the connection node of variable resistors R1 and R2 at its plus input node, a p channel MOS transistor Q10 having a source connected to the output node of differential amplify circuit 20, and a gate and drain connected to the minus input node of differential amplify circuit 20, and a constant current source circuit 210 for drawing out a predetermined constant current from the drain of p channel MOS transistor Q10.

Differential amplify circuit 20 provides a verify potential VPVRFY.

The potential level of the minus input node of differential amplify circuit 20 is represented as Vb hereinafter.

Constant current source circuit 210 includes a variable resistor R3 having one end connected to the node to which power supply potential Vcc is supplied, a p channel MOS transistor Q3 having a source connected to the node to which power supply potential Vcc is supplied, and having a gate connected to the other end of variable resistor R3, a p channel MOS transistor Q4 having a source connected to the other end of variable resistor R3, and a gate connected to the drain of p channel MOS transistor Q3, an n channel MOS transistor Q1 connected between the drain of p channel MOS transistor Q3 and the node to which ground potential is supplied, and having a gate maintained at the level of power supply potential Vcc, an n channel MOS transistor Q2 having a source and drain connected between the drain of p channel MOS transistor Q4 and the node to which ground potential is applied, and having the drain and gate connected, and an n channel MOS transistor Q5 having a drain connected to the drain of p channel MOS transistor Q10, a source connected to the node to which ground potential is supplied, and the gate connected to the gate of n channel MOS transistor Q2.

The operation of verify potential generation circuit 200 will be described hereinafter. A predetermined constant current always flows to p channel MOS transistor Q10 by constant current source 210.

The potential level Vb of the minus node of differential amplify circuit 20 takes a value which is output potential level VPVRFY of differential amplifier circuit 20 shifted by (VQ10th+α) which is the sum of threshold value VQ10th of transistor Q10 and a constant α according to the current flowing to transistor Q10.

More specifically, the following relationship is established.

$$Vb=VPVRFY-(VQbth+\alpha) \qquad (6)$$

The result of comparing this potential Vb with the potential Va=[R2/(R1+R2)]·Vcc at the connection node of variable resistors R1 and R2 is output as VPVRFY from differential amplify circuit 20.

Figure 11:
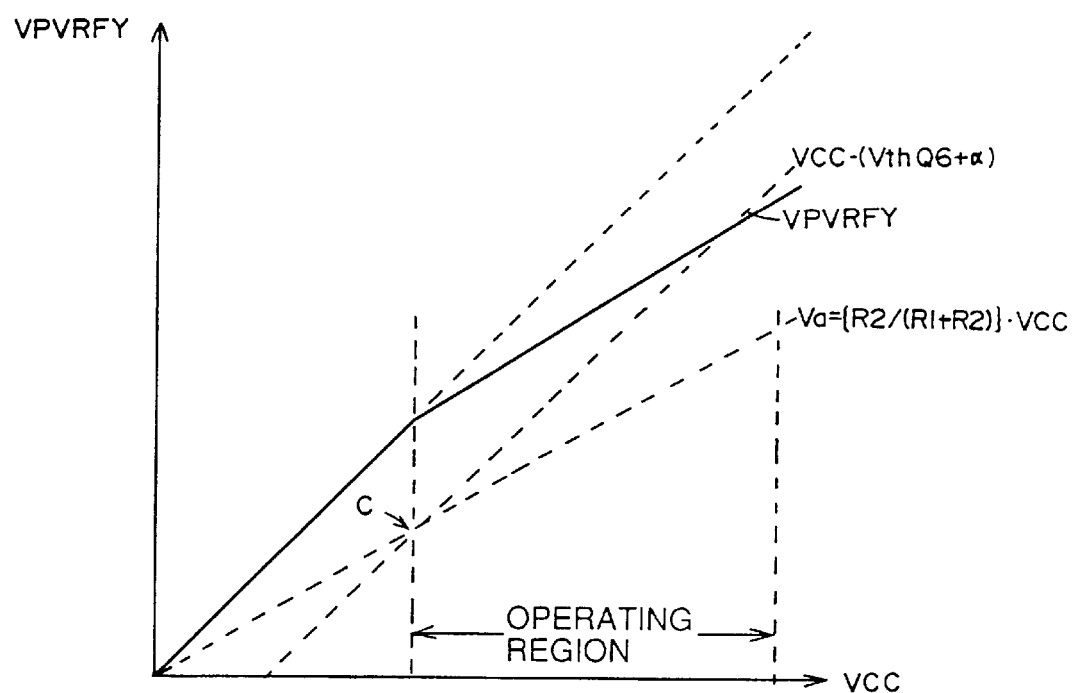
FIG. 11 is a diagram for describing an operation of verify voltage generation circuit 200.
Figures 12A, 12B:
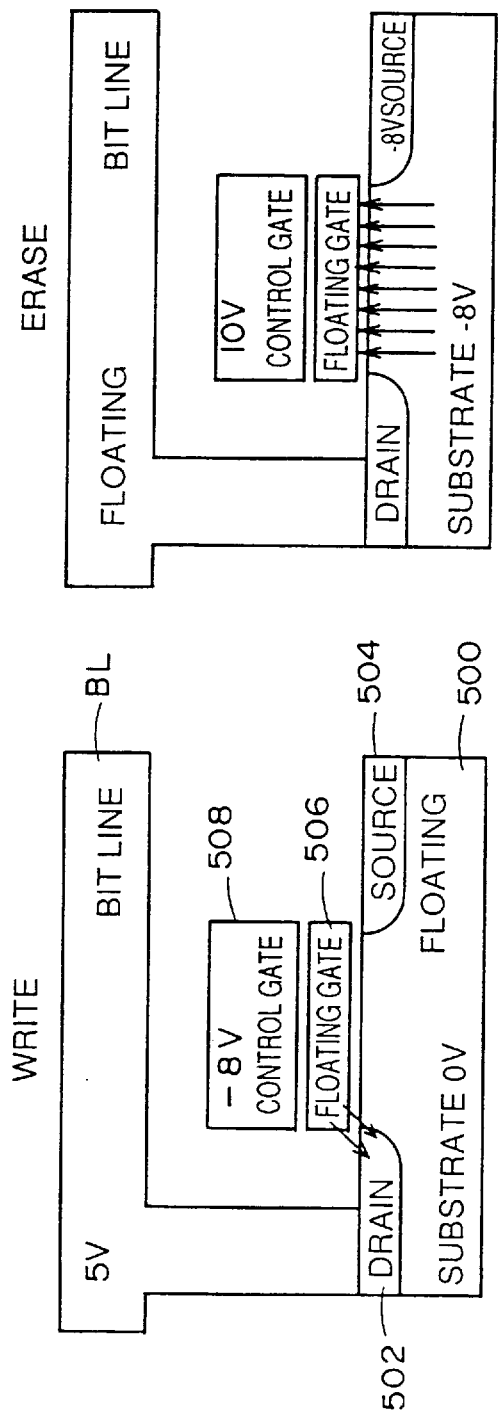
FIGS. 12(a) and 12(b) are schematic cross sections of a memory cell transistor of a conventional non-volatile semiconductor memory device for describing the structure and operation thereof, wherein (a) and (b) show the potential of the various elements in write and erase operations, respectively.
Figure 14:
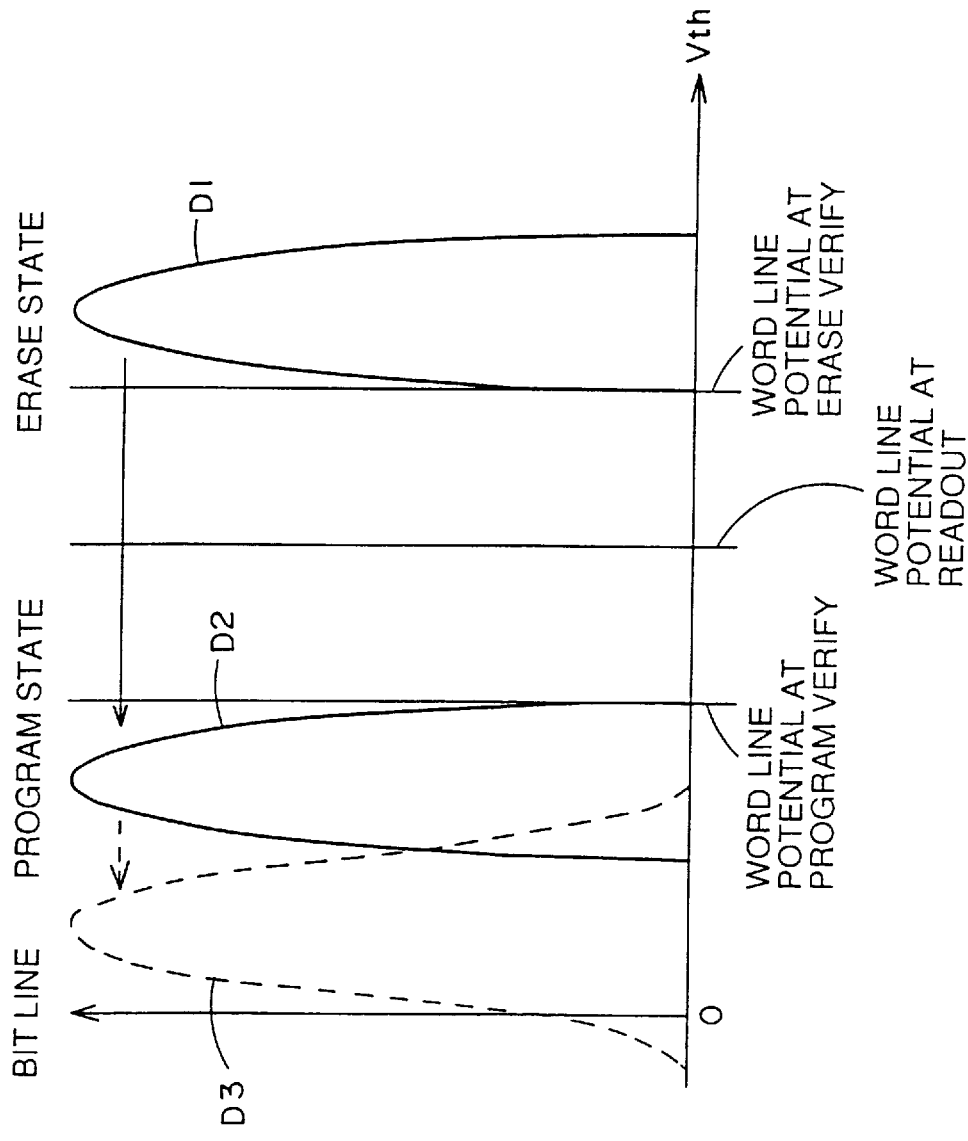
FIG. 14 shows a threshold value distribution of a memory cell transistor in a program operation of a conventional non-volatile semiconductor memory device.

FIG. 11 is a diagram for describing an operation of the verify potential generation circuit of FIG. 10.

In the following, a segment and a gradient of potential VPVRFY provided from differential amplify circuit 20 on Vcc will be obtained on the basis of the dependency of potential Va on power supply potential Vcc.

Since differential amplify circuit 20 amplifies and provides the comparison result of potential Va and potential Vb, a segment of the dependency of program verify potential VPVRFY on power supply potential Vcc can be obtained as set forth in the following.

The value of Vcc at a crossing point C between the straight line of equation Va=[R2/(R1+R2)]·Vcc depicted by a dotted line and the straight line of Vcc−(VQ10th+α) becomes the value of the segment in FIG. 11.

When power supply potential Vcc becomes higher than the value of crossing point C, differential amplify circuit 20 compares potential Va with potential Vb fed back from the output node to provide an output. Therefore, the dependency of that output potential of VPVRFY on Vcc has a gradient identical to the dependency of potential Va on Vcc as indicated by the solid line in FIG. 11.

In other words, program verify potential VPVRFY provided from program verify potential generation circuit 200 has a gradient represented by the resistance ratio of variable resistors R1 to R2, and a segment represented as set forth in the following by the current flowing from constant current source circuit 210 and a constant determined by the threshold value VQ10 of transistor Q10.

$$VPVRFY=[R2/(R1+R2)]\cdot Vcc+(VQ10th+\alpha) \qquad (7)$$

Thus, output potential VPVRFY of verify potential generation circuit 200 has a dependency on power supply potential Vcc represented by a linear function. Similar to program potential generation circuit 100 of the first embodiment, margin between cell threshold value V'thp of a memory cell after a write operation and a word line potential in a readout operation can be ensured even when the threshold value of the conductance of the memory cell of sense amplifier 128 is altered according to variation in power supply potential Vcc.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a memory cell array including a plurality of memory cells arranged in a matrix of rows and columns,
    memory cell select means for selectively carrying out data readout/writing with any of said memory cells,
    wherein each memory cell includes first and second nodes, and a control node, and has a conductance between said first and second nodes varied according to a potential of said control node controlled by said memory cell select means, and has the conductance varied in a non-volatile manner according to data to be written when the potential of said control node is a first potential,
  said non-volatile semiconductor memory device further comprising:
    readout amplify means operated by having said first potential supplied for providing a signal according to a comparison result of said conductance of a corresponding memory cell and a threshold value according to said first potential, and
    internal control means selectively supplying a second potential to said control node of said corresponding memory cell for verifying data written into said corresponding memory cell according to an output of said readout amplify means,
    wherein said internal control means alters said second potential towards a decreasing direction of said conductance according to reduction of said threshold value that alters according to a value of said first potential.

2. A non-volatile semiconductor memory device comprising:
    a memory cell array including a plurality of memory cells arranged in a matrix of rows and columns, a plurality of word lines provided corresponding to rows of said memory cell array, first internal voltage generation means for supplying a first potential according to an external power supply potential, wherein each memory cell includes first and second nodes, and a control node connected to a corresponding word line, and has a conductance between said first and second nodes varied according to a potential of said control node, and has a readout conductance where the potential of said control node is said first potential varied in a non-volatile manner according to data to be written, said non-volatile semiconductor memory device further comprises:

a plurality of bit lines provided corresponding to columns of said memory cell array, each bit line connected to said first node of at least one memory cell, second internal voltage generation means for supplying a second potential, data write means to select any of said word lines and any of said bit lines according to an external address signal for carrying out a write operation with respect to a corresponding memory cell, a plurality of sense amplifiers each connected to the corresponding memory cell via a pair of said bit lines, and operated by having said first potential supplied for providing readout data according to a comparison result of said conductance of said corresponding memory cell and a threshold value according to said first potential, and write control means for controlling said data write means to repeat a write operation until said conductance of said corresponding memory cell attains a value of data corresponding to external write data according to an output of said sense amplifier when said second potential is selectively applied to said corresponding word line, wherein said second internal voltage generation means alters said second potential to a decreasing direction of said conductance of said corresponding memory cell according to reduction of said threshold value that is altered according to a value of said first potential.

3. The non-volatile semiconductor memory device according to claim 2, wherein each said sense amplifier comprises current supply means operated by receiving said first potential for supplying a current flowing across said first and second nodes of said corresponding memory cell via said bit lines, and potential detection means for detecting a potential of a connection node of said bit line and said current supply means to provide said readout data.

4. The non-volatile semiconductor memory device according to claim 2, wherein each memory cell includes a floating gate type transistor, wherein said floating gate type transistor includes a floating gate formed on a first oxide film of a first film thickness on a main surface of a semiconductor of a first conductivity type, a drain region of a second conductivity type formed at the main surface of the semiconductor in proximity to said floating gate, a source region of the second conductivity type in proximity to said floating gate, and formed on the main surface of the semiconductor at a side facing said drain region with respect to said floating gate, and a control gate layered on said floating gate with a second oxide film of a second film thickness, wherein said control node is connected to said control gate, said first node is connected to said drain region, and said second node is connected to said source region.

5. The non-volatile semiconductor memory device according to claim 3, wherein said second internal voltage generation means comprises a first variable resistor receiving said first potential at one end and having another end connected to a reference potential node, a second variable resistor having one end connected to said reference potential node, and another end receiving a ground potential, a constant current source for supplying a predetermined constant current to said second variable resistor, and differential amplify means including first and second input nodes and an output node, having said reference potential node connected to said first input node, and having said output node connected to said second input node for supplying said second potential to said output node.

6. The non-volatile semiconductor memory device according to claim 5, wherein each of said first and second variable resistors includes a plurality of resistors connected in series between said one end and said another end, and a plurality of fuse elements connected in parallel to said plurality of resistors respectively.

7. The non-volatile semiconductor memory device according to claim 5, wherein each of said first and second variable resistors includes a plurality of resistors connected in series between said one end and said another end, and a plurality of switch means connected in parallel to said plurality of resistors respectively, wherein each of said switch means is opened/closed according to a control signal from said write control means.

8. The non-volatile semiconductor memory device according to claim 5, wherein each of said first and second variable resistors includes a plurality of resistors connected in series between said one end and said another end, and a plurality of switch means connected between respective connection nodes of said plurality of resistors and said one end, and opened/closed according to a control signal from said write control means.

9. The non-volatile semiconductor memory device according to claim 3, wherein said second internal voltage generation means includes a first variable resistor receiving said first potential at one end, and having another end connected to a reference potential node, a second variable resistor having one end connected to said reference potential node, and another end receiving a ground potential, differential amplify means including first and second input nodes and an output node for connecting said first input node to said reference potential node, an MOS transistor connected between said output node and said second input node, and diode-connected with a direction from said output node towards said second input node as a forward direction, and a constant current source for receiving a constant current flowing from said MOS transistor in the forward direction.

10. The non-volatile semiconductor memory device according to claim 9, wherein each of said first and second variable resistors includes a plurality of resistors connected in series between said one end and said another end, and a plurality of fuse elements connected in parallel to said plurality of resistors respectively.

11. The non-volatile semiconductor memory device according to claim 9, wherein each of said first and second variable resistors includes a plurality of resistors connected in series between said one end and said another end, and a plurality of switch means connected in parallel to said plurality of resistors respectively, wherein each of said switch means is opened/closed according to a control signal from said write control means.

12. The non-volatile semiconductor memory device according to claim 9, wherein each of said first and second variable resistors includes a plurality of resistors connected in series between said one end and said another end, and a plurality of switching means connected between respective connection nodes of said plurality of resistors and said one end, and opened/closed according to a control signal from said write control means.

* * * * *